US010838529B2

(12) United States Patent
Kim et al.

(10) Patent No.: US 10,838,529 B2
(45) Date of Patent: Nov. 17, 2020

(54) TOUCH DISPLAY PANEL AND TOUCH DISPLAY DEVICE

(71) Applicant: LG DISPLAY CO., LTD., Seoul (KR)

(72) Inventors: SangUk Kim, Seoul (KR); Byoungson Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 109 days.

(21) Appl. No.: 16/125,847

(22) Filed: Sep. 10, 2018

(65) Prior Publication Data
US 2019/0107909 A1 Apr. 11, 2019

(30) Foreign Application Priority Data
Oct. 11, 2017 (KR) .................. 10-2017-0131353

(51) Int. Cl.
*G02F 1/1333* (2006.01)
*G06F 3/041* (2006.01)
*G02F 1/1335* (2006.01)
*G02F 1/1368* (2006.01)
*G02F 1/1362* (2006.01)
(Continued)

(52) U.S. Cl.
CPC .......... *G06F 3/0412* (2013.01); *G02F 1/1368* (2013.01); *G02F 1/13338* (2013.01); *G02F 1/133514* (2013.01); *G02F 1/136286* (2013.01); *G09G 3/20* (2013.01); *H01L 27/322* (2013.01); *H01L 51/5253* (2013.01); *G02F 2202/22* (2013.01); *G06F 3/044* (2013.01); *G06F 3/0416* (2013.01); *G06F 2203/04107* (2013.01); *G09G 3/3266* (2013.01); *G09G 3/3275* (2013.01); *G09G 3/3677* (2013.01); *G09G 3/3688* (2013.01); *G09G 2310/08* (2013.01); *G09G 2354/00* (2013.01); *H01L 27/323* (2013.01)

(58) Field of Classification Search
CPC .................................................... G05D 1/0225
See application file for complete search history.

(56) References Cited

U.S. PATENT DOCUMENTS 5,844,370 A * 12/1998 Cathey .................. H01J 3/022
315/169.1
2008/0062373 A1 * 3/2008 Kim ..................... G02F 1/1345
349/151
(Continued)

FOREIGN PATENT DOCUMENTS

KR 10-2007-0048974 * 5/2007 ........... G02F 1/1345
KR 10-2007-0048974 A 5/2007
(Continued)

OTHER PUBLICATIONS

Office Action dated Dec. 12, 2018 issued in the corresponding Korean Patent Application No. 10-2017-0131353, pp. 1-5.

*Primary Examiner* — Sang V Nguyen
(74) *Attorney, Agent, or Firm* — Polsinelli PC

(57) ABSTRACT

The present disclosure enables sensing of a touch input at one or more edges of a touch enabled device while preventing touch drive signals for driving pixels of a touch panel of the device to be grounded. One aspect of the present disclosure provides a display device including a first substrate and a second substrate; a plurality of touch electrodes between the first substrate and the second substrate; a ground wire coupled to a portion of the first substrate via a resistor; and a conductive layer coupled to the ground wire via a conductive member.

19 Claims, 11 Drawing Sheets

(51) Int. Cl.
  *G09G 3/20* (2006.01)
  *H01L 51/52* (2006.01)
  *H01L 27/32* (2006.01)
  *G06F 3/044* (2006.01)
  *G09G 3/3266* (2016.01)
  *G09G 3/3275* (2016.01)
  *G09G 3/36* (2006.01)

(56) References Cited

U.S. PATENT DOCUMENTS

| | | | | | |
|---|---|---|---|---|---|
| 2014/0078719 | A1* | 3/2014 | Jung | ........................ | H05K 5/02 |
| | | | | | 362/97.1 |
| 2014/0138141 | A1* | 5/2014 | Li | ........................ | H05K 1/0259 |
| | | | | | 174/261 |
| 2014/0375351 | A1* | 12/2014 | Fukami | .............. | G01R 31/2822 |
| | | | | | 324/763.01 |
| 2015/0153779 | A1* | 6/2015 | Ko | ........................ | G06F 1/1652 |
| | | | | | 345/173 |
| 2016/0246417 | A1* | 8/2016 | Liu | ........................ | H01L 23/60 |
| 2017/0123533 | A1* | 5/2017 | Jo | ........................... | G06F 3/044 |
| 2017/0192580 | A1* | 7/2017 | Jung | .................... | G06F 3/0416 |
| 2018/0335918 | A1* | 11/2018 | Wang | .................... | G06F 3/0446 |
| 2020/0027929 | A1* | 1/2020 | Lee | ........................ | H01L 27/323 |

FOREIGN PATENT DOCUMENTS

| | | | | | |
|---|---|---|---|---|---|
| KR | 1020070048974 | | * | 5/2007 | ........... G02F 1/1345 |
| KR | 10-2010-0004835 | | * | 5/2010 | ........... G02F 1/1333 |
| KR | 10-2010-0048353 | A | | 5/2010 | |
| KR | 10-2020-0048353 | | * | 5/2010 | ............. G02F 1/133 |
| KR | 1020100048353 | | * | 5/2010 | ........... G02F 1/1333 |
| KR | 10-2015-0035256 | | * | 4/2015 | ........... G02F 1/1333 |
| KR | 10-2015-0035256 | A | | 4/2015 | |
| KR | 1020150035256 | | * | 4/2015 | ........... G02F 1/1333 |

* cited by examiner

TOUCH DISPLAY PANEL AND TOUCH DISPLAY DEVICE

CROSS REFERENCE TO RELATED APPLICATION

This application claims priority from Korean Patent Application No. 10-2017-0131353, filed on Oct. 11, 2017, which is hereby incorporated by reference in its entirety for all purposes as if fully set forth herein.

BACKGROUND

Field of Disclosure

The present disclosure relates to a touch display panel and a touch display device.

Description

With the development of information society, various demands for display devices for displaying images have increased, and various types of display device such as liquid crystal display devices, plasma display devices and organic light emitting display devices are used.

The display device provides a function of recognizing a user's touch on a display panel and performing input processing based on the recognized touch in order to service the user.

For example, a touch display device enabling touch recognition may embed a plurality of touch electrodes into a display panel or arrange a plurality of touch electrodes on a display panel, and sense a user's touch on the display panel on the basis of a change in capacitance generated by the user's touch.

Meanwhile, in order to prevent static electricity flowing in the display panel, the touch display device may form an electrostatic discharge path by disposing a conductive layer on the front surface of the display panel and connecting the conductive layer to a ground disposed in an outer area of the display panel.

At this time, since capacitance is formed between the conductive layer and the touch electrode due to a large potential difference between the conductive layer and the touch electrode in an edge area of the display panel close to a position at which the conductive layer is connected to the ground, a touch in the edge area of the display panel cannot be recognized.

Furthermore, when the potential of the ground increases to improve a touch recognition performance, there may occur a problem in that it inhibits an electrostatic discharge or it influences a logic signal applied to a gate driving circuit for driving of a gate line.

SUMMARY

One or more aspects of the present disclosure provide a touch enabled device capable of sensing touch inputs at edges of the touch enabled device by reducing a corresponding potential difference while ensuring proper electrostatic discharge and feeding of logical signals to a gate driving circuit of the touch enabled device.

One aspect of the present disclosure provides a display device including a first substrate and a second substrate; a plurality of touch electrodes between the first substrate and the second substrate; a ground wire coupled to a portion of the first substrate via a resistor; and a conductive layer coupled to the ground wire via a conductive member.

One aspect of the present disclosure provides a display device including a first layer and a second layer; a plurality of touch electrodes between the first layer and the second layer, the plurality of touch electrodes configured to sense a touch input received at the display device; a conductive layer coupled to the second layer; and a first ground wire and a second ground wire, the first ground wire is coupled to the conductive layer and the second ground wire being coupled to the first layer, the first and second ground wires being separated from each another.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
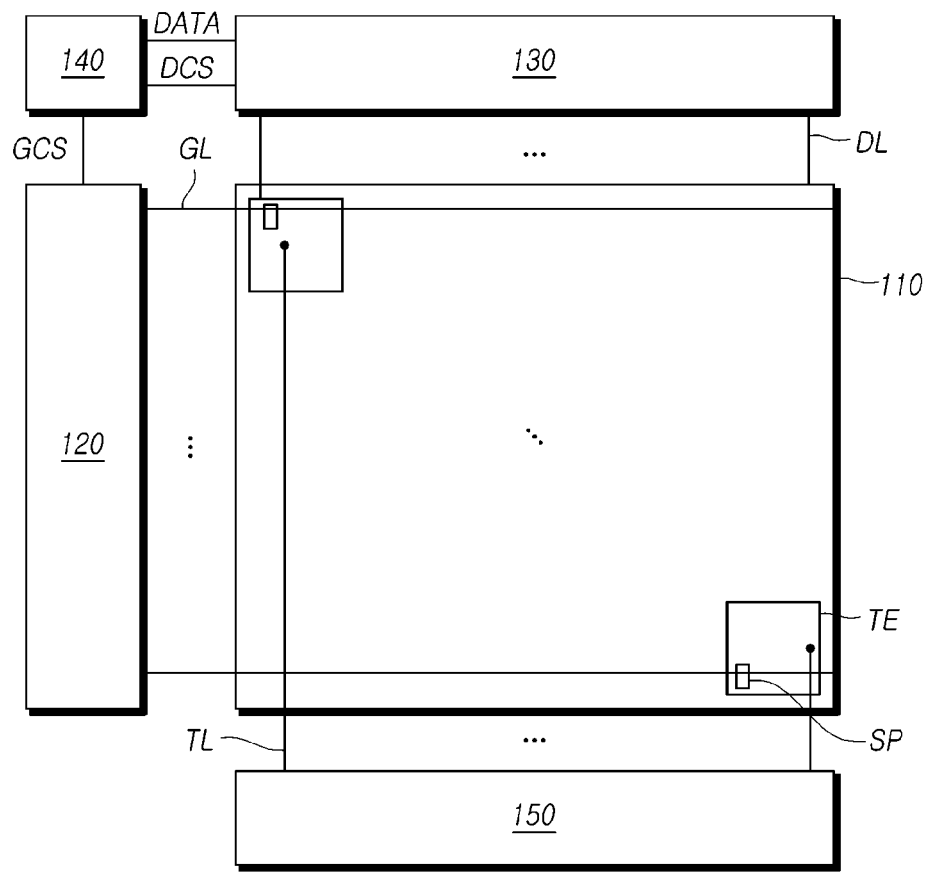
FIG. 1 schematically illustrates the configuration of a touch display device according to one or more aspects of the present disclosure.

Hereinafter, some example embodiments of the present disclosure will be described in detail with reference to the accompanying illustrative drawings. In designating elements of the drawings by reference numerals, the same elements will be designated by the same reference numerals although they are shown in different drawings. Furthermore, in the following description of the present disclosure, a detailed description of known functions and configurations incorporated herein will be omitted when it may make the subject matter of the present disclosure rather unclear.

Reference to "one example" or "an example" means that a particular feature, structure, or characteristic described in connection with the example is included in at least one example of the disclosure. The appearances of the phrase "in one example" in various places in the specification are not necessarily all referring to the same example, nor are separate or alternative example mutually exclusive of other examples. Moreover, various features are described which may be exhibited by some examples and not by others. Similarly, various requirements are described which may be requirements for some examples but not other examples.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various examples given in this specification.

Without intent to limit the scope of the disclosure, examples of instruments, apparatus, methods and their related results according to the examples of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

In the same context, it will be understood that when an element is referred to as being formed "on" or "under" another element, not only can it be directly formed on or under another element, but it can also be indirectly formed on or under another element via an intervening element. By contrast, when an element is referred to as being "directly on," or "directly under," to another element, there are no intervening elements present.

The terminology used herein is for the purpose of describing particular examples only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of examples. However, it will be understood by one of ordinary skill in the art that examples may be practiced without these specific details. For example, systems may be shown in block diagrams so as not to obscure the examples in unnecessary detail. In other instances, well-known processes, structures and techniques may be shown without unnecessary detail in order to avoid obscuring example examples.

In the following description, illustrative examples will be described with reference to acts and symbolic representations of operations (e.g., in the form of flow charts, flow diagrams, data flow diagrams, structure diagrams, block diagrams, etc.) that may be implemented as program services or functional processes include routines, programs, objects, components, data structures, etc., that perform particular tasks or implement particular abstract data types and may be implemented using hardware at network elements. Non-limiting examples of such hardware may include one or more Central Processing Units (CPUs), digital signal processors (DSPs), application-specific-integrated-circuits, field programmable gate arrays (FPGAs), computers or the like.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

For clarity of explanation, in some instances the present technology may be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

FIG. 1 schematically illustrates the configuration of a touch display device 100 according to one or more aspects of the present disclosure.

Referring to FIG. 1, the touch display device 100 according to example embodiments of the present disclosure includes a touch display panel 110 on which a plurality of gate lines (GL), a plurality of data lines (DL), a plurality of subpixels (SP), a plurality of touch lines (TL), and a plurality of touch electrodes (TE) are arranged.

Furthermore, the touch display device 100 may include a gate driving circuit 120, a data driving circuit 130, and a controller 140 as elements for display driving, and may include a touch driving circuit 150 as an element for touch driving.

The gate driving circuit 120 controls driving timing of the subpixels (SP) arranged on the touch display panel 110 by outputting scan signals to the plurality of gate lines (GL).

The gate driving circuit 120 sequentially drives the plurality of gate lines (GL) by sequentially supplying scan signals of an on voltage or an off voltage to the plurality of gate lines (GL) according to a control of the controller 140.

The gate driving circuit 120 may be located only on one side of the touch display panel 110 or on both sides of the touch display panel 110 according to a driving scheme.

Furthermore, the gate driving circuit 120 may include one or more Gate Driver Integrated Circuits (GDICs).

Each GDIC may be connected to a bonding pad of the touch display panel 110 in a Tape Automated Bonding (TAB) type or a Chip On Glass (COG) type or may be directly disposed on the touch display panel 110 in a Gate In Panel (GIP) type.

The GDIC may be integrated into the display panel 110 or may be implemented in a Chip On Film (COF) type in which the GDIC is mounted on a film connected to the touch display panel 110.

The data driving circuit 130 outputs a data voltage to the data line (DL) according to timing at which the scan signal is applied through the gate line (GL), so that each subpixel (SP) expresses brightness according to image data.

When a particular gate line (GL) is open, the data driving circuit 120 drives the plurality of data lines (DL) by converting image data received from the controller 140 into an analog type data voltage and supplying the data voltage to the plurality of data lines (DL).

The data driving circuit 130 may include at least one Source Driver Integrated Circuit (SDIC) and drive the plurality of data lines.

Each SDIC may be connected to the bonding pad of the touch display panel 110 in a TAB type or a COG type, directly disposed on the touch display panel 110, or integrated into the display panel 110.

Furthermore, each SDIC may be implemented in a COF type. In this case, one end of each SDIC is bonded to at least one source printed circuit board and the other end is bonded to the touch display panel 110.

The controller 140 supplies various types of control signals to the gate driving circuit 120 and the data driving circuit 130, and controls the operation of the gate driving circuit 120 and the data driving circuit 130.

The controller 140 starts a scan according to timing implemented in each frame, converts input image data (or external data) received from the outside according to a data signal format used by the data driving circuit 130, outputs the converted image data, and controls data driving at a proper time according to the scan.

The controller 140 receives various timing signals including a vertical synchronization signal (Vsync), a horizontal synchronization signal (Hsync), an input Data Enable (DE) signal, a clock signal (CLK), and the like as well as the input image data from the outside (for example, a host system).

In addition to converting the input image data received from the outside according to the data signal format used by the data driving circuit 130 and outputting the converted image, the controller 140 may generate various control signals based on the received timing signal and output the generated control signals to the gate driving circuit 120 and the data driving circuit 130 in order to control the gate driving circuit 120 and the data driving circuit 130.

For example, in order to control the gate driving circuit 120, the controller 140 outputs various Gate Control Signals (GCSs) including a Gate Start Pulse (GSP), a Gate Shift Clock (GSC), a Gate Output Enable (GOE) signal, and the like.

[31] The gate start pulse (GSP) controls operation start timing of one or more gate driver integrated circuits included in the gate driving circuit 120. The gate shift clock (GSC) is a clock signal input into the one or more gate driver integrated circuits in common and controls shift timing of the scan signal. The gate output enable signal (GOE) specifies timing information of one or more gate driver integrated circuits.

Furthermore, in order to control the data driving circuit 130, the controller 140 outputs various Data Control Signals (DCSs) including a Source Start Pulse (SSP), a Source Sampling Clock (SSC), a Source Output Enable (SOE) signal, and the like.

The source start pulse (SSP) controls data sampling start timing of one or more source driver integrated circuits included in the data driving circuit 130. The source sampling clock (SSC) is a clock signal that controls data sampling timing in each source driver integrated circuit. The source output enable signal (SOE) controls output timing of the data driving circuit 130.

The controller 140 may be arranged on a control printed circuit board connected to a source printed circuit board, to which at least one source driver integrated circuit is bonded, through a connection medium such as a Flexible Flat Cable (FFC) or a Flexible Printed Circuit (FPC).

A power controller for supplying various voltages to the touch display panel 110, the gate driving circuit 120, and the data driving circuit 130 or controlling various voltages or currents to be supplied, may be further arranged on the control printed circuit board.

The touch driving circuit 150 drives the plurality of touch electrodes (TE) arranged on the touch display panel 110 and senses a change in capacitance generated by a touch.

The touch driving circuit 150 may apply a touch driving signal to the plurality of touch electrodes (TE) during a display driving period and a temporally divided touch driving period, receive a touch sensing signal from the plurality of touch electrodes (TE), and sense a change in capacitance.

In sensing the change in capacitance, the touch driving circuit 150 may sense the change in capacitance through self-capacitance sensing or mutual capacitance sensing.

When the touch driving circuit 150 senses the change in capacitance through the self-capacitance sensing, the touch driving circuit 150 applies the touch driving signal to each of the plurality of touch electrodes (TE) arranged on the touch display panel 110 and senses the change in capacitance through the touch sensing signal received from each of the touch electrodes (TE).

When the touch driving circuit 150 senses the change in capacitance through the mutual capacitance sensing, the touch driving circuit 150 may apply the touch driving signal to a TX electrode arranged on the touch display panel 110, receive the touch sensing signal from an RX electrode, and sense the change in capacitance.

Alternatively, the touch driving circuit 150 may perform the self-capacitance sensing and the mutual capacitance sensing on the basis of the time division scheme, and sense the change in capacitance.

A touch controller (not shown) may recognize the existence or non-existence of a user's touch on the touch display panel 110 and a touch location (touch coordinates) through the change in capacitance sensed by the touch driving circuit 150.

The touch display device 100 enabling touch recognition may be any type of display device such as a liquid crystal display device or an organic light emitting display device.

Figure 2:
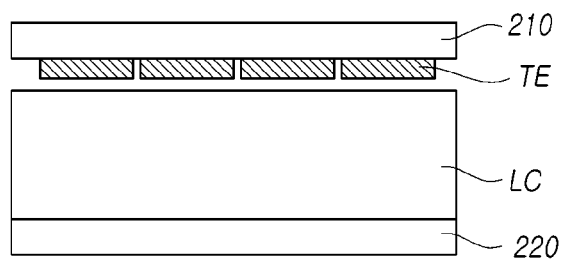
FIGS. 2 and 3 illustrate examples of the cross-sectional structure of the touch display device according to one or more aspects of the present disclosure.
Figure 3:
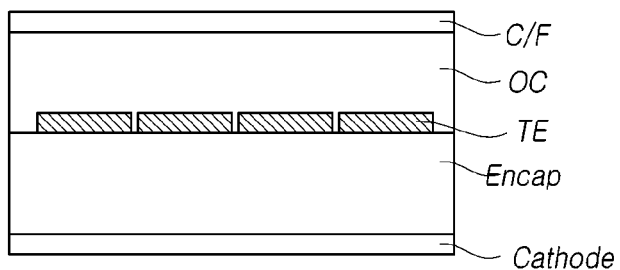

FIGS. 2 and 3 illustrate examples of the cross-sectional structure of the touch display device 100 enabling touch recognition, according to one or more aspects of the present disclosure. FIG. 2 illustrates an example of the liquid crystal display device and FIG. 3 illustrates an example of the organic light emitting display device.

Referring to FIG. 2, when the touch display device 100 according to example embodiments of the present disclosure is the liquid crystal display device, a liquid crystal layer (LC) may be disposed between a first substrate 210 and a second substrate 220, and a plurality of touch electrodes (TE) may be disposed on the bottom side of the first substrate 210.

The first substrate 210 may be a thin film transistor substrate on which a plurality of gate lines (GL), a plurality of data lines (DL), and a plurality of subpixels (SP) are disposed.

The second substrate 220 may be a color filter substrate on which a color filter for indicating colors such as red (R), green (G), and blue (B) is disposed.

The plurality of touch electrodes (TE) may be disposed on the bottom side of the first substrate 210 and, for example, may be a common electrode (Vcom) to which a common voltage is applied when a display is driven.

That is, when the common electrode (Vcom) is used as the touch electrode (TE), the common voltage may be applied to the plurality of touch electrodes (TE) during the display driving period and the touch driving signal may be applied during the touch driving period.

Furthermore, the plurality of touch electrodes (TE) may be disposed on the first substrate 210 in an add-on type rather than being located between the first substrate 210 and the second substrate 220.

That is, FIG. 2 illustrates an example of the structure in which the touch electrodes (TE) are disposed on the liquid crystal display device, and the structure in which the touch electrodes (TE) are disposed is not limited thereto.

Referring to FIG. 3, when the touch display device 100 is the organic light emitting display device, the plurality of touch electrodes (TE) may be disposed on an encapsulation layer (Encap).

For example, a cathode (Cathode) is disposed on an organic light emission layer (not shown) and the encapsulation layer (Encap) is disposed on the cathode (Cathode). The plurality of touch electrodes (TE) is disposed on the encapsulation layer (Encap).

An over coating layer (OC) may be disposed on the plurality of touch electrodes (TE) and a color filter layer (C/F) may be disposed on the over coating layer (OC).

That is, in comparison between the example of the structure illustrated in FIG. 3 and the structure illustrated in FIG. 2, the structure below the encapsulation layer (Encap) may correspond to the first substrate 210 and the color filter layer (C/F) may correspond to the second substrate 220.

Alternatively, the color filter layer (C/F) may be first disposed on the encapsulation layer (Encap), the over coating layer (OC) may be disposed on the color filter layer (C/F), and the plurality of touch electrodes (TE) may be disposed on the over coating layer (OC).

Like the add-on type described above, the color filter layer (C/F) may be first disposed on the encapsulation layer (Encap) and then the plurality of touch electrodes (TE) may be disposed on the top side of the color filter layer (C/F).

As described above, the touch display device 100 according to example embodiments of the present disclosure may arrange the touch electrodes (TE) in various structures in various types of display device and sense a user's touch on the touch display panel 110.

Meanwhile, the touch display device 100 according to example embodiments of the present disclosure may provide the structure for discharging static electricity flowing into the touch display panel 110.

Figure 4:
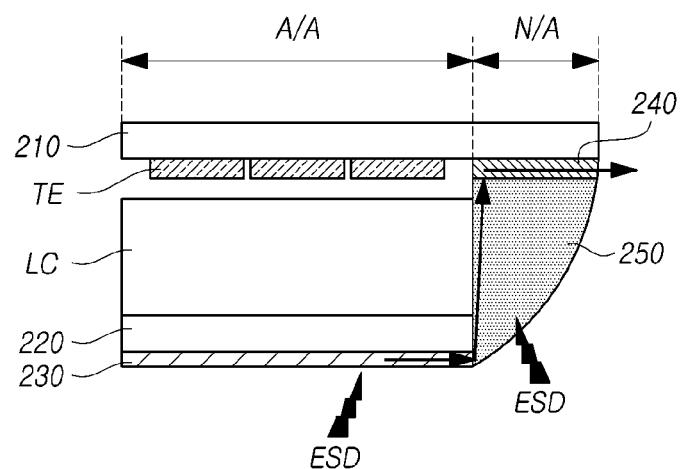
FIG. 4 illustrates an example of the electrostatic discharge structure in the touch display device according to one or more aspects of the present disclosure.

FIG. 4 illustrates an example of the electrostatic discharge structure in the touch display device 100 according to example embodiments of the present disclosure, which is the liquid crystal display device.

Referring to FIG. 4, the touch display device 100 according to example embodiments of the present disclosure includes a first substrate 210, a plurality of touch electrodes (TE) disposed on the bottom side of the first substrate 210, a liquid crystal layer (LC) located on the bottom side of the plurality of touch electrodes (TE), and a second substrate 220 disposed on the liquid crystal layer (LC).

A conductive layer 230 may be disposed on a rear surface of the second substrate 220, and the conductive layer 230 may be, for example, Indium Tin Oxide (ITO) but is not limited thereto.

A ground wire 240 grounded to the ground may be disposed in a non-active area (N/A) which is an outer area of an active area (A/A) on the first substrate 210.

The ground wire 240 may be grounded to the ground of the source printed circuit board on which the data driving circuit 130 connected to the touch display panel 110 is mounted.

The ground wire 240 disposed in the non-active area (N/A) of the first substrate 210 and the conductive layer 230 disposed on the rear surface of the second substrate 220 may be electrically connected through a conductive member 250.

The conductive member 250 is located on bottom side of the first substrate 210 and the lateral side of the second substrate 220 and connects the conductive layer 230 and the ground wire 240.

The conductive member 250 may be formed through Ag dotting or formed using a conductive tape.

Static electricity flowing from the outside may be discharged to the outside through the conductive layer 230, the conductive member 250, and the ground wire 240 by disposing the conductive layer 230 having conductivity on the rear surface of the second substrate 220 and connecting the conductive layer 230 with the ground wire 240 through the conductive member 250.

Figure 5:
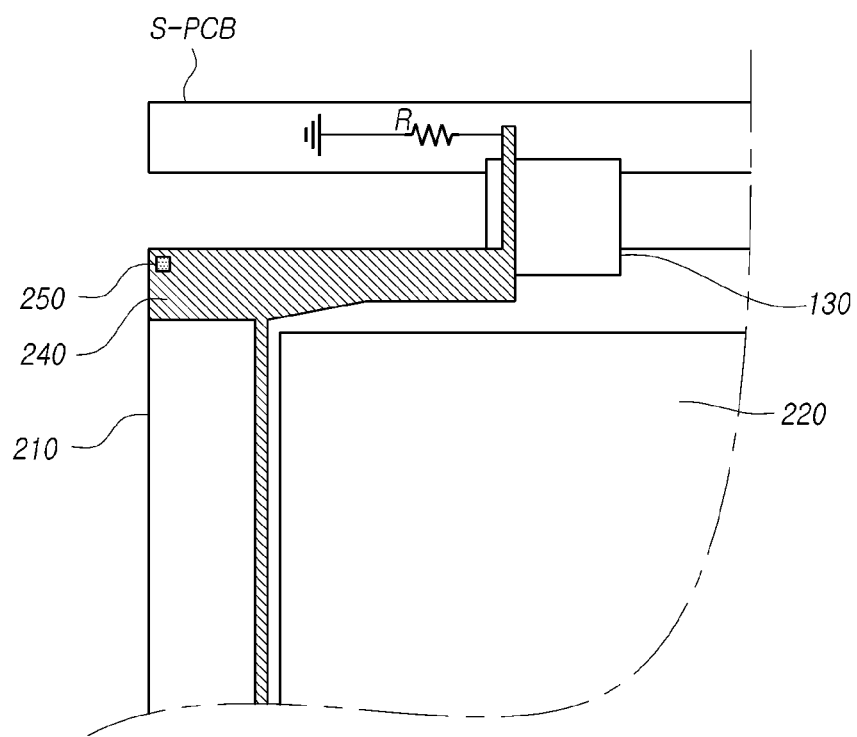
FIG. 5 is a plan view of the touch display device illustrated in FIG. 4, according to one or more aspects of the present disclosure.

FIG. 5 illustrates an example of the plane structure of the touch display panel 110 on which the ground wire 240 is disposed in the touch display device 100 illustrated in FIG. 4.

Referring to FIG. 5, the ground wire 240 is disposed in the outer area of the first substrate 210, and at least part of the ground wire 240 is connected to the conductive member 250.

The ground wire 240 may extend to the touch printed circuit board through a film on which the data driving circuit 120 or a source driver integrated circuit connected to the touch display panel 110 is disposed and may be grounded to the ground of the source printed circuit board.

As the ground wire 240 is disposed in the outer area of the first substrate 210, a potential difference may be generated between the plurality of touch electrodes (TE) disposed in the active area (A/A) of the first substrate 210 and the ground wire 240.

The potential difference between the touch electrodes (TE) disposed in the central part of the active area (A/A) and the ground wire 240 is not large but the potential difference between the touch electrodes (TE) disposed in the edge part of the active area (A/A) and the ground wire 240 is large, so that it may be difficult to perform touch sensing in the edge part.

Accordingly, as illustrated in FIG. 5, by disposing resistance in the part in which the ground wire 240 is grounded to the ground of the source printed circuit board, the potential difference between the ground wire 240 and the touch electrodes (TE) may be reduced.

Therefore, through the reduction in the potential difference between the touch electrodes (TE) in the edge part of the active area (A/A) and the ground wire 240, the touch sensing can be performed, but electrostatic discharge may be not easy due to an increase in a resistance value of the ground wire 240.

Furthermore, an increase in a voltage level of the ground wire 240 may influence logic signals (For example, GSP, GSC, and GOE) input to the gate driving circuit 120 for driving the plurality of gate lines (GL) disposed on the touch display panel 110, so that the gate driving circuit 120 may not normally output the scan signal.

Through the structure in which the ground wire 240 disposed in the outer area of the touch display panel 110 is separated, the touch display device 100 according to example embodiments of the present disclosure improves the touch sensing performance, and the touch display panel 110 and the touch display device 100 which do not influence electrostatic discharge and logical signals input to the gate driving circuit 120 are provided.

Figure 6:
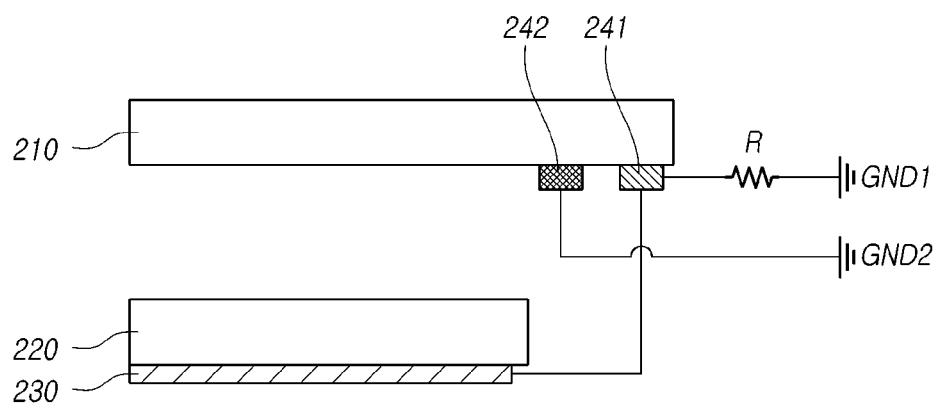
FIG. 6 illustrates a concept of the structure in a ground for electrostatic discharge and a ground for a gate driving circuit are separated from each other in the touch display device according to one or more aspects of the present disclosure.

FIG. 6 illustrates a concept of the structure of the touch display device 100 according to one or more aspects of the present disclosure.

Referring to FIG. 6, the touch display device 100 according to example embodiments of the present disclosure includes a first substrate 210, a second substrate 220 located below the first substrate 210, and a conductive layer 230 disposed on the rear surface of the second substrate 220.

A first ground wire 241 and a second ground wire 242 disposed to be separated from each other may be disposed in an outer area of the first substrate 210. The first ground wire 241 and the second ground wire 242 may be electrically insulated from each other.

The first ground wire 241 may be electrically connected to the conductive layer 230 disposed on the rear surface of the second substrate 220 and may be grounded to a first ground (GND1).

The second ground wire 242 may be grounded to a second ground (GND2), and the second ground (GND2) may be the same as or different from the first ground (GND1).

A voltage level of the first ground wire 241 and a voltage level of the second ground wire 242 may be different from each other, and the voltage level of the first ground wire 241 may be higher than the voltage level of the second ground wire 242. For example, a resistance value of the first ground wire 241 may be higher than a resistance value of the second ground wire 242.

That is, in the touch display device 100 according to example embodiments of the present disclosure, two or more ground wires 240, which are separated from each other and have different voltage levels (or resistance values), may be disposed in the outer area of the first substrate 210.

Among the two or more ground wires 240, the first ground wire 241 having a higher resistance value may be electrically connected to the conductive layer 230 disposed on the rear surface of the second substrate 220 and provide an electrostatic discharge path.

Furthermore, the first ground wire 241 is connected to resistance and thus reduces the potential difference from the touch electrodes (TE) disposed in the edge part of the active area (A/A), thereby making touch sensing in the edge part of the active area (A/A) possible.

At this time, the magnitude of the resistance connected to the first ground wire 241 may be selected as a proper value for reducing the potential difference from the touch electrodes (TE) and enabling electrostatic discharge. For example, when the conductive layer 230 is ITO, by determining the magnitude of resistance connected to the first ground wire 241 as several kΩ (for example, 1 to 5 kΩ), touch sensing is possible and an electrostatic discharge path can be provided.

The second ground wire 242 may have a resistance value lower than that of the first ground wire 241 and may be connected to the gate driving circuit 120 for driving the gate lines (GL) disposed on the touch display panel 110. Furthermore, a ground voltage level of a logic signal input to the gate driving circuit 120 may be changed according to the voltage level of the second ground wire 242.

That is, it is possible to maintain the ground voltage level of the logic signal input to the gate driving circuit 120 to be low according to the voltage level of the second ground wire 242 by connecting the second ground wire 242 having the low resistance value to the gate driving circuit 120. Accordingly, it is possible to prevent the ground voltage level of the logic signal input to the gate driving circuit 120 from increasing due to an increase in the voltage level of the ground wire 240.

Therefore, according to examples embodiments of the present disclosure, it is possible to provide the touch sensing performance and the electrostatic discharge performance and prevent the influence on the logic signal input to the gate driving circuit 120 by providing the structure in which the ground wire 240 disposed in the outer area of the first substrate 210 is separated into wires having different resistance values.

Figure 7:
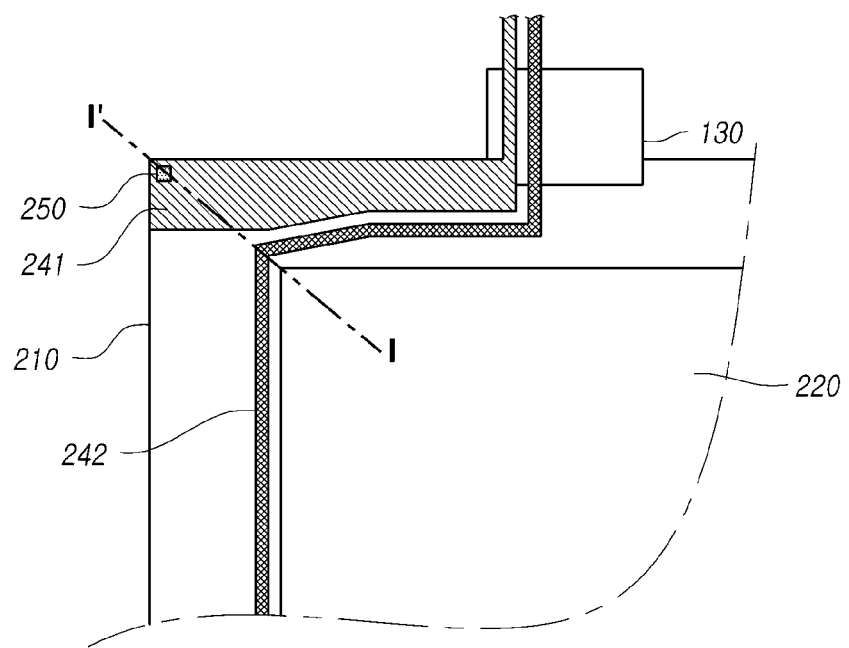
FIG. 7 illustrates an example of the plan structure in which a ground for electrostatic discharge and a ground for a gate driving circuit are separated from each other in the touch display device according to one or more aspects of the present disclosure.

FIG. 7 is a plan view illustrating an example of the structure in which the first ground wire 241 for electrostatic discharge and the second ground wire 242 for the gate driving circuit 120 are separated in the touch display device 100 according to one or more aspects of the present disclosure.

Referring to FIG. 7, in the touch display device 100 according to example embodiments of the present disclosure, the first ground wire 241 and the second ground wire 242, which are separated from each other, are disposed in the outer area of the first substrate 210. Furthermore, the first ground wire 241 and the second ground wire 242 are electrically insulated.

The first ground wire 241 may be disposed on at least one side of the outer area of the first substrate 210 and may be electrically connected to the conductive layer 230 disposed on the rear surface of the second substrate 220 through the conductive member 250.

The second ground wire 242 may be disposed along the edge of the active area (A/A) in the outer area of the first substrate 210 and may be connected to the gate driving circuit 120.

The second ground wire 242 may be disposed between the first ground wire 241 and the active area (A/A). That is, the first ground wire 241 and the second ground wire 242 may be disposed in the outer area of the active area (A/A), and the first ground wire 241 may be disposed in the outermost area of the first substrate 210.

The first ground wire 241 and the second ground wire 242 may be disposed on the data driving circuit 130 or the film on which the data driving circuit 130 is disposed, and may be grounded to the ground of the source printed circuit board on which the data driving circuit 130 is mounted.

The first ground wire 241 and the second ground wire 242 may have different resistance values, and the resistance value of the first ground wire 241 may be higher than the resistance value of the second ground wire 242.

Accordingly, by reducing the potential difference between the touch electrode (TE) and the first ground wire 241, it is possible to perform touch sensing in the edge part of the active area (A/A) and discharge static electricity flowing into the touch display panel 110 through the first ground wire 241 connected to the conductive layer 230 disposed on the rear surface of the second substrate 220.

Furthermore, by connecting the gate driving circuit 120 and the second ground wire 242, it is possible to prevent a ground voltage level of a logic signal input to the gate driving circuit 120 from increasing.

In addition, by disposing the second ground wire 242 between the first ground wire 241 and the active area (A/A) and disposing the first ground wire 241 in the outermost area of the first substrate 210, it is possible to easily form an electrostatic discharge path that connects the first ground wire 241 and the conductive layer 230 disposed on the rear surface of the second substrate 220.

Figure 8:
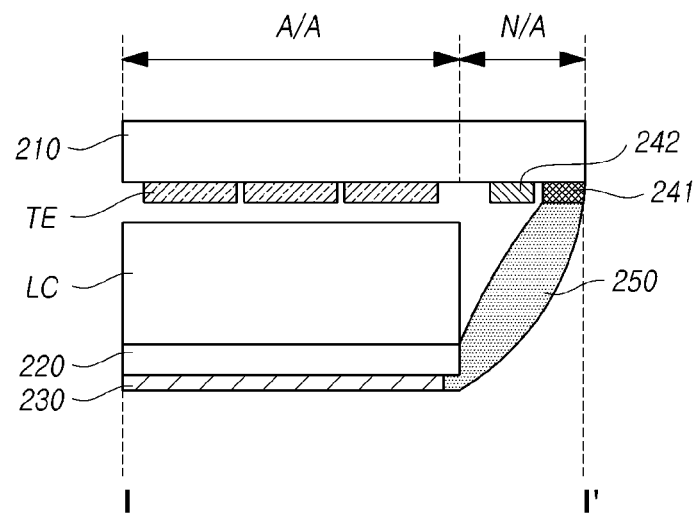
FIG. 8 is a cross-sectional view illustrating the touch display device of FIG. 7 cut along the line I-I', according to one or more aspects of the present disclosure.

FIG. 8 is a cross-sectional view of the touch display device 100 of FIG. 7 cut along the line I-I'.

Referring to FIG. 8, the touch display device 100 according to example embodiments of the present disclosure includes the first substrate 210 including an active area (A/A) and a non-active area (N/A) and the plurality of touch electrodes (TE) disposed on the bottom side of the first substrate 210.

Furthermore, the second substrate 220 is located below the plurality of touch electrodes (TE) and the conductive layer 230 is disposed on the rear surface of the second substrate 220.

The first ground wire 241 and the second ground wire 242 are disposed in the outer area of the first substrate 210, and the first ground wire 241 and the second ground wire 242 are separated from each other.

The first ground wire 241 is electrically connected to the conductive layer 230 disposed on the rear surface of the second substrate 220 through the conductive member 250.

Furthermore, the second ground wire 242 is connected to the gate driving circuit 120.

The first ground wire 241 may have a high resistance value within a range for making electrostatic discharge possible, so that a potential difference from the touch electrode (TE) disposed in an edge part of the active area (A/A) may be reduced and an electrostatic discharge path may be provided. Furthermore, by disposing the first ground wire 241 in the outermost area of the first substrate 210, it is possible to easily form the conductive member 250 that connects the first ground wire 241 and the conductive layer 230 disposed on the rear surface of the second substrate 220.

By maintaining a ground voltage level of the second ground wire 242, it is possible to maintain a ground voltage level of a logic signal input to the gate driving circuit 120 connected to the second ground wire 242.

Figure 9:
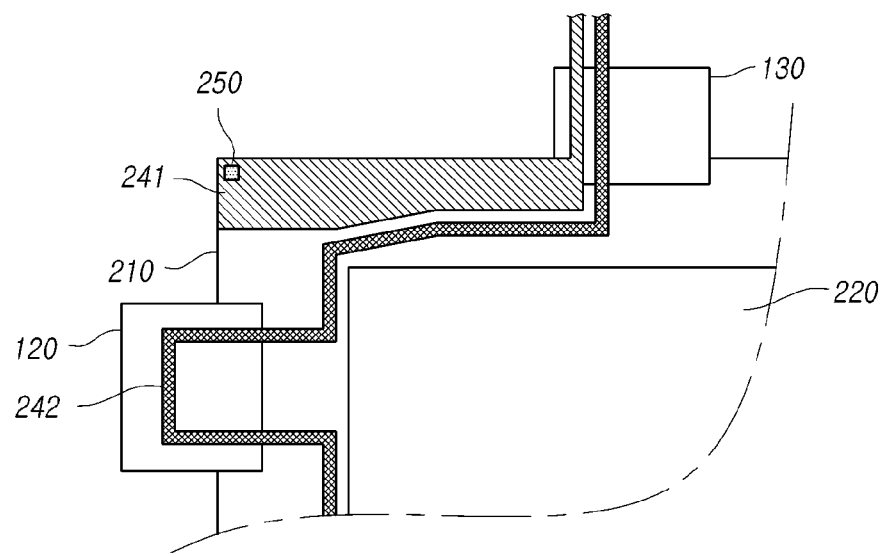
FIG. 9 illustrates an example of the structure in which the ground wire for the gate driving circuit is disposed in the touch display device of FIG. 7, according to one or more aspects of the present disclosure.

FIG. 9 illustrates an example of the structure in which the second ground wire 242 for the gate driving circuit 120 is connected to the gate driving circuit 120 in the touch display device 100 illustrated in FIG. 7.

Referring to FIG. 9, the first ground wire 241 may be disposed in the outer area of the active area (A/A), and the second ground wire 242 separated from the first ground wire 241 may be disposed along the edge of the active area (A/A).

Furthermore, the second ground wire 242 may extend to the gate driving circuit 120 disposed on one side of the touch display panel 110 in the outer area of the active area (A/A) and may be connected to the gate driving circuit 120.

When a plurality of gate driving circuits 120 is disposed on one side of the touch display panel 110, the second ground wire 242 may be connected to other gate driving circuits 120 in the same structure.

Furthermore, even when the gate driving circuits 120 are disposed on both sides of the touch display panel 110, the second ground wire 242 may be connected to the gate driving circuits 120 in the same structure.

The connection structure between the second ground wire 242 and the gate driving circuit 120 is only an example, and the present disclosure is not limited thereto.

The second ground wire 242 controls a ground voltage level of a logic signal input to the gate driving circuit 120. That is, the ground voltage level of the logic signal input to the gate driving circuit 120 is controlled according to the voltage level of the second ground wire 242.

At this time, since the second ground wire 242 maintains the ground voltage level, it is possible to prevent the ground voltage level of the logic signal input to the gate driving circuit 120 from increasing.

Accordingly, it is possible to prevent a malfunction of the gate driving circuit 120 due to an increase of potential of the ground connected to the gate driving circuit 120.

Figure 10:
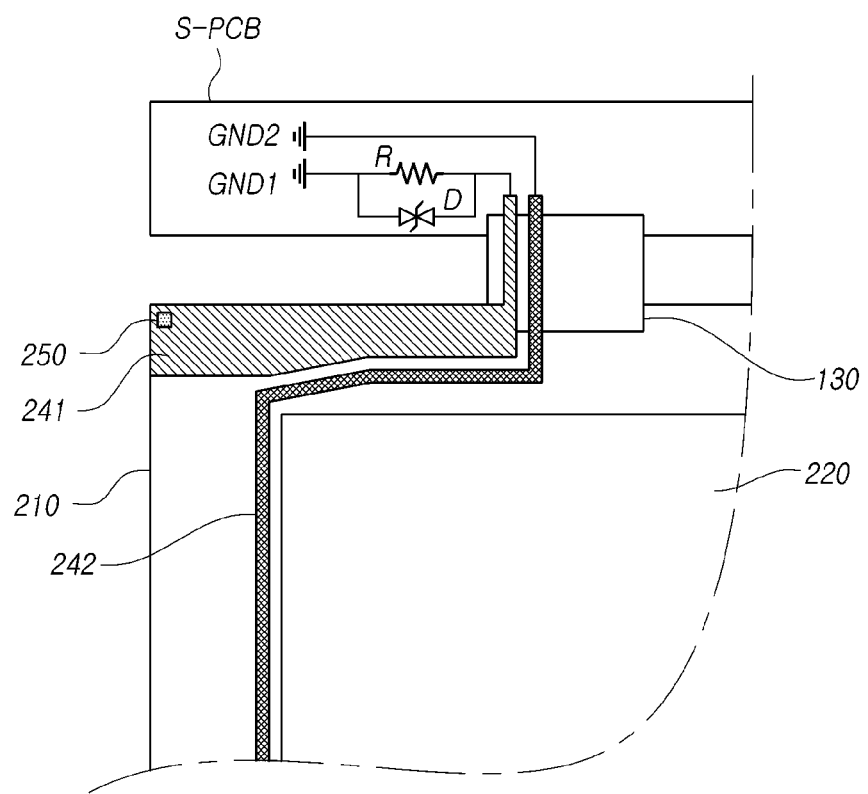
FIG. 10 illustrates an example of the structure in which separated ground wires are grounded to grounds in the touch display device of FIG. 7, according to one or more aspects of the present disclosure.

FIG. 10 illustrates an example of the structure in which the first ground wire 241 and the second ground wire 242 are grounded in the structure of the touch display device 100 illustrated in FIG. 7.

Referring to FIG. 10, the first ground wire 241 may be disposed in the outer area of the first substrate 210 and on the source printed circuit board on which the data driving circuit 130 is mounted, and may be grounded to the first ground (GND1).

Furthermore, the second ground wire 242 may be disposed in the outer area of the first substrate 210 and on the source printed circuit board on which the data driving circuit 130 is mounted, and may be grounded to the second ground (GND2).

The first ground (GND1) and the second ground (GND2) may be the same as or different from each other.

Furthermore, the first ground wire 241 and the second ground wire 242 may be grounded to other grounds located outside the source printed circuit board.

The first ground wire 241 may be grounded to the first ground (GND1) and may be connected to resistance for making touch sensing possible and to a diode for electrostatic discharge.

However, the second ground wire 242 may be directly grounded to the second ground (GND2) without being connected to resistance.

Accordingly, the first ground wire 241 may provide a discharge path of static electricity flowing into the touch display panel 110 and make touch sensing in the edge part of the active area (A/A) possible.

Furthermore, by making touch sensing in the edge part of the active area (A/A) possible, the second ground wire 242 may prevent an increase in the ground voltage level of the logic signal input to the gate driving circuit 120.

Figure 11:
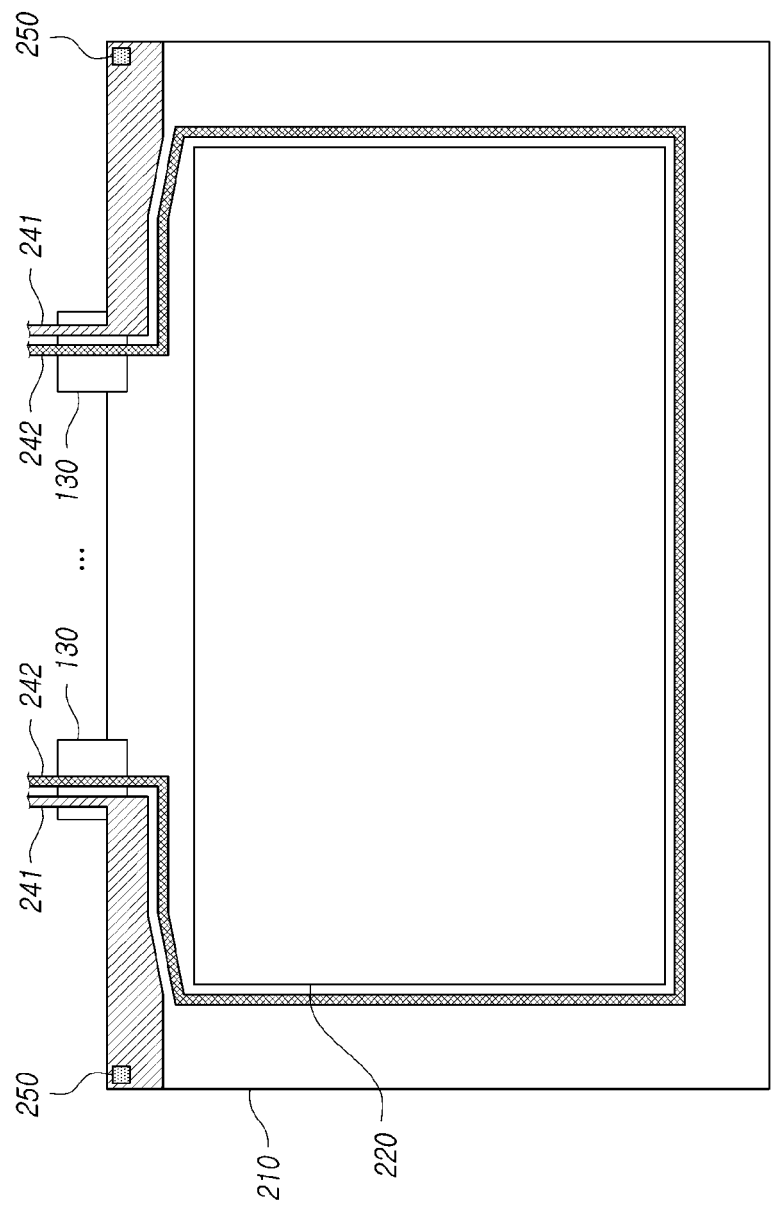
FIG. 11 illustrates an example of the total structure of separated ground wires in the touch display device of FIG. 7, according to one or more aspects of the present disclosure.

FIG. 11 illustrates an example of the total structure in which the first ground wire 241 and the second ground wire 242 are disposed in the touch display device 100 according to one or more aspects of the present disclosure.

Referring to FIG. 11, in the touch display device 100 according to example embodiments of the present disclosure, the first ground wire 241 and the second ground wire 242, which are separated from each other, may be disposed in the outer area of the first substrate 210.

The first ground wire 241 may be disposed on at least one side of the first substrate 210, and may be disposed in every area corresponding to a vertex of the edge part in which the data driving circuit 130 is disposed in the touch display panel 110 as illustrated in FIG. 11.

Furthermore, the first ground wire 241 may be also disposed in an area corresponding to an opposite vertex in the touch display panel 110.

By disposing the first ground wire 241 connected to the conductive layer 230 disposed on the rear surface of the second substrate 220 in every area corresponding to the vertex of the touch display panel 110, it is possible to provide a discharge path of static electricity flowing into the touch display panel 110.

The second ground wire 242 may be disposed in the outer area of the first substrate 210 along the edge of the active area (A/A).

The number of second ground wires 242 may be one or more, and the second ground wire 242 is connected to the gate driving circuit 120 and controls the ground voltage level of the logic signal input to the gate driving circuit 120.

Accordingly, it is possible to prevent the ground level of the logic signal input to the gate driving circuit 120 from being influenced by the first ground wire 241 for the touch sensing performance and the electrostatic discharge performance.

According to example embodiments of the present disclosure, by disposing the first ground wire 241, which has a predetermined resistance value and is connected to the conductive layer 230 disposed on the rear surface of the second substrate 220, in the outer area of the touch display panel 110, it is possible to perform touch sensing in the edge part of the active area (A/A) and to provide an electrostatic discharge path.

Furthermore, by disposing the second ground wire 242, which has the ground voltage level and is connected to the gate driving circuit 120, to be separated from the first ground wire 241, it is possible to prevent the ground voltage level of the logic signal input to the gate driving circuit 120 from increasing.

Accordingly, in the structure in which the ground wire 240 for touch sensing and electrostatic discharge is disposed, it is possible to prevent the ground voltage level of the logic signal input to the gate driving circuit 120 from increasing and to normally output the scan signal.

Although a preferred example embodiment of the present disclosure has been described for illustrative purposes, those skilled in the art will appreciate that various modifications, additions and substitutions are possible, without departing from the scope and spirit of the disclosure as disclosed in the accompanying claims. Therefore, exemplary embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

What is claimed is:

1. A display device comprising:
a first substrate and a second substrate;
a plurality of touch electrodes between the first substrate and the second substrate;
a ground wire coupled to a portion of the first substrate via a resistor to provide an electrostatic discharge path;
a conductive layer coupled to the ground wire via a conductive member;
a ground for a gate driving circuit connected to the gate driving circuit,
wherein the ground wire is separated from the ground for the gate driving circuit to prevent from increasing a ground level of a logic signal input to the gate driving circuit, and
wherein the ground wire is disposed in a non-active outer area of the first substrate and electrically connected to a ground located in a source printed circuit board of the display device and is extended onto a data driving circuit of the display device and the first substrate, and
wherein the resistor is directly connected between the ground for the source printed circuit board and the ground wire.

2. The display device of claim 1, wherein the conductive layer is coupled to the second substrate and is made of Indium Tin Oxide (ITO).

3. The display device of claim 1, wherein
the plurality of touch electrodes are coupled to an active area of the first substrate, the active area of the first substrate including a plurality of pixels coupled to a plurality of gate lines, a plurality of data lines and a plurality touch lines such that the active area of the first substrate is configured to operate as a touch sensing area or a display area of the display device; and the portion of the first substrate to which the ground wire is coupled is a non-active area of the first substrate.

4. The display device of claim 3, wherein the non-active area surrounds the active area of the display device.

5. The display device of claim 1, wherein
the resistor is configured to reduce an electrical potential difference between the ground wire and the plurality of touch electrodes to enable sensing a touch at an edge of the display device.

6. The display device of claim 1, wherein
the display device is a liquid crystal display device;
the first substrate is a thin film transistor substrate including a plurality of gate lines, a plurality of data lines and a plurality of subpixels;
the plurality of touch electrodes are coupled to a bottom surface of the first substrate; and
the second substrate is a color filter substrate for displaying different colors on the display device.

7. The display device of claim 1, wherein
the display device is an organic light emitting device display;
the plurality of touch electrodes are between an encapsulation layer and an over coat layer;
the first substrate is a cathode layer coupled to a bottom surface of the encapsulation layer and positioned on an organic light emission layer; and
the second substrate is a color filter on top of the over coat layer.

8. A display device comprising:
a first layer and a second layer;
a plurality of touch electrodes between the first layer and the second layer, the plurality of touch electrodes configured to sense a touch input received at the display device;
a conductive layer coupled to the second layer; and
a first ground wire and a second ground wire, the first ground wire is coupled to the conductive layer and the second ground wire being coupled to a gate driving circuit through the first layer, the first and second ground wires being separated from each another,
wherein the first ground wire is disposed in an area corresponding to a vertex of an edge part of a display panel where a data driving circuit is disposed, and the second ground wire surrounds the second layer,
wherein the first ground wire is disposed in a non-active outer area of the first layer and electrically connected to a ground located in a source printed circuit board of the display device and is extended onto a data driving circuit of the display device and the first layer, and
wherein at least one of a resistor and a diode is directly connected between the ground of the source printed circuit board and the first ground wire.

9. The display device of claim 8, wherein the first ground wire and the second ground wire are electrically insulated from each other.

10. The display device of claim 8, wherein the second ground wire is not connected to the conductive layer but is connected to the ground of the source printed circuit board of the display device.

11. The display device of claim 8, wherein a voltage level of the first ground wire is different from a voltage level of the second ground wire.

12. The display device of claim 11, wherein the voltage level of the first ground wire is higher than the voltage level of the second ground wire.

13. The display device of claim 8, wherein the first ground wire is configured to provide an electrostatic discharge path for static electricity flowing through the display device.

14. The display device of claim 8, wherein the first ground wire is directly coupled to the conductive layer via the conductive member.

15. The display device of claim 14, wherein the conductive member is formed of Ag dotting or a conductive tape.

16. The display device of claim 8, wherein the first ground wire is coupled to an outermost area of a non-active portion of the first layer.

17. The display device of claim 16, wherein the second ground wire is between the first ground wire and an edge of an active area of the first layer, the active area of the first layer including a plurality of pixels coupled to a plurality of gate lines, a plurality of data lines and a plurality touch lines such that the active area of the first layer is configured to operate as a touch sensing area or a display area of the display device.

18. The display device of claim 17, wherein the second ground wire is between the edge of the active area and the first ground wire coupled to an outermost area of the first layer.

19. The display device of claim 8, wherein
the first ground wire is connected to the ground via at least one of the resistor that enables the sensing of the touch input at the one or more edges and the diode that enables an electrostatic discharge of static electricity flowing through the display device; and
the second ground wire is directly connected to a ground.

* * * * *